United States Patent [19]
Domanski

[11] Patent Number: 5,924,212
[45] Date of Patent: Jul. 20, 1999

[54] ELECTRONIC COMPASS

[75] Inventor: Stanley J. Domanski, Huntington, Ind.

[73] Assignee: Donnelly Corporation, Holland, Mich.

[21] Appl. No.: 08/944,360

[22] Filed: Oct. 6, 1997

Related U.S. Application Data

[60] Provisional application No. 60/027,996, Oct. 9, 1996.

[51] Int. Cl.[6] .............................. G01C 17/30; G01R 33/00
[52] U.S. Cl. ......................... 33/355 R; 324/247; 324/260
[58] Field of Search .................................. 33/355 R, 356, 33/357, 361; 324/247, 253, 260

[56] References Cited

U.S. PATENT DOCUMENTS

| | | | |
|---|---|---|---|
| 2,374,166 | 4/1945 | Beach et al. | 324/253 |
| 2,475,593 | 7/1949 | Craddock et al. | 324/253 |
| 3,396,329 | 8/1968 | Salvi . | |
| 3,416,072 | 12/1968 | Fussell et al. . | |
| 3,432,751 | 3/1969 | Godby et al. . | |
| 3,435,337 | 3/1969 | Inouye et al. . | |
| 3,461,382 | 8/1969 | Anderson . | |
| 3,461,387 | 8/1969 | Morris et al. . | |
| 3,490,024 | 1/1970 | Sherrill et al. . | |
| 3,634,946 | 1/1972 | Star | 33/1 PT |
| 3,644,825 | 2/1972 | Davis, Jr. et al. | 324/247 |
| 3,768,011 | 10/1973 | Swain . | |
| 3,903,610 | 9/1975 | Heaviside et al. | 33/361 |
| 3,936,949 | 2/1976 | Devaud | 33/361 |
| 3,952,420 | 4/1976 | Benjamin et al. | 33/361 |
| 4,095,348 | 6/1978 | Kramer | 33/1 PT |
| 4,179,741 | 12/1979 | Rossani | 33/356 |
| 4,182,987 | 1/1980 | Moeller | 324/249 |
| 4,241,317 | 12/1980 | Breitling . | |
| 4,305,034 | 12/1981 | Long et al. | 324/253 |
| 4,340,861 | 7/1982 | Sparks | 324/205 |
| 4,402,034 | 8/1983 | Parker et al. | 324/253 |
| 4,424,631 | 1/1984 | Franks | 33/361 |
| 4,640,016 | 2/1987 | Tanner et al. | 33/356 |
| 4,641,094 | 2/1987 | Dalton, Jr. | 324/260 |
| 4,728,888 | 3/1988 | Bauer et al. | 33/361 |
| 4,733,181 | 3/1988 | Bauer | 324/253 |
| 4,851,775 | 7/1989 | Kim et al. | 324/247 |
| 5,039,945 | 8/1991 | Webb | 324/253 |
| 5,239,264 | 8/1993 | Hawks | 324/253 |
| 5,255,442 | 10/1993 | Schierbeek et al. | 33/361 |
| 5,440,232 | 8/1995 | Scarzello et al. | 324/247 |
| 5,632,092 | 5/1997 | Blank et al. | 33/361 |
| 5,661,398 | 8/1997 | Sham et al. | 324/247 |
| 5,802,727 | 9/1998 | Blank et al. | 33/356 |

FOREIGN PATENT DOCUMENTS

| | | |
|---|---|---|
| 0045509 | 12/1985 | European Pat. Off. . |
| 945835 | of 0000 | U.S.S.R. . |

OTHER PUBLICATIONS

Allied Signal Advanced Materials Technical Bulletin Metflas® Magnetic Alloy 2705M (Colbalt–based), no date.

IEEE Transactions on Magnetics, vol. Mag–20, No. 5, Sep. 1984.

*Primary Examiner*—G. Bradley Bennett
*Attorney, Agent, or Firm*—Van Dyke, Gardner, Linn & Burkhart, LLP

[57] ABSTRACT

An electronic compass includes at least two coil assemblies. Each coil assembly has a magnetic axis which is oriented at a known angle to that of the other coil. Each coil assembly has a pair of substantially identical coils having magnetic axes that are parallel in a reverse sense. The compass further includes an oscillator which oscillates at a frequency which is dependent upon the inductances of the coils. A current source causes current to flow in the coils and a switch alternately couples the current source to each of the coils of the coil assemblies. A processor analyzes the frequencies of oscillation of the oscillator when each of the coil assemblies is coupled to the current source in order to compute geographic orientation based upon the analysis.

41 Claims, 15 Drawing Sheets

ELECTRONIC COMPASS

CROSS REFERENCE TO RELATED APPLICATIONS

This application claims priority from Provisional Patent Application Serial No. 60/027,996 filed on Oct. 9, 1996.

BACKGROUND OF THE INVENTION

The present invention relates to direction heading sensors or compasses. More specifically, the present invention relates to electronic compasses for automobiles which determine geographic orientation based upon electronic circuit elements which are sensitive to alignment within the Earth's magnetic field.

In general, compasses determine geographic orientation with reference to the Earth's magnetic field, which generally runs north and south for most populated parts of the Earth. While the magnetic poles of the earth are not located in the same position as the Earth's geographic poles, the magnetic north pole is generally an acceptable approximation to the geographic north pole. Conventional compasses employ a freely movable, magnetically sensitive member which aligns itself with the Earth's magnetic field and points towards the Earth's magnetic north pole.

Electronic compasses, on the other hand, determine geographic orientation without using a magnetically sensitive, movable member. In general, electronic compasses determine geographic orientation by simultaneously measuring the magnitude of the earth' magnetic field in at least two different directions which are related to each other at a known angle. Because the measurements are dependant upon the orientation of the measuring device, they can be used to determine the deviation of the compass's orientation from magnetic north, which is an approximation of geographic north. As an example, if the two measurements are taken at an angle of 90° with respect to each other, the angular deviation of the compass's orientation with respect to magnetic north can be computed by taking the arctangent of the ratio of the two measurements. Because any number has more than one arctangent, further techniques must be used to determine which is the correct angle. For example, if the two measurements are equal, their ratio will be one, and the arctangent will be 45° and 225° (among other multiples of 360°). Resolving which of these two possibilities is correct is accomplished by techniques which will be more fully described herein.

Measuring the magnitude of the Earth's magnetic field in a particular direction is generally accomplished through the use of materials whose magnetic permeability depends upon the magnitude of an external magnetic field, such as the Earth's. Thus, as these materials are rotated in the presence of the Earth's external magnetic field, their magnetic permeability will change due to the changing strength of the Earth's magnetic field when measured in different directions. Furthermore, because the inductance of a coil is dependent upon the magnetic permeability of its core material, a change in inductance can be detected by using this material as the core of a coil. By sensing these inductance changes, which can be electronically measured by using an oscillator circuit or the like, the magnitude of the Earth's magnetic field in a particular direction can be electronically measured. The changes in inductance are typically measured by employing an oscillator circuit whose frequency of oscillation is dependent upon the inductance. As the inductance changes, both frequency and amplitude changes will occur in the oscillating signal. Either or both of these changes can be the basis for determining the magnitude of the Earth's magnetic field in that particular direction.

There are several problems which arise in electronic compasses operating according to the above described principles. These include both the cost and complexity of the circuitry necessary to analyze the changes in frequency or amplitude of the oscillating signal. Additional problems arise due to the fact that the permeability of the core material tends to drift over time and with temperature changes. It is therefore an object of a present invention to provide a digital electronic compass which is both inexpensive to manufacture and operates with a minimum of complexity. It is another object the invention to provide a digital electronic compass which is unaffected by the permeability drift of the core material. It is still another object of the present invention to provide an electronic compass powered by a constant current source which is substantially unaffected by changes in ambient temperature. These and other objects of the invention will be apparent upon further review of this specification when read in light of the appended drawings.

SUMMARY OF THE INVENTION

The electronic compass of the present invention consists of at least two coil assemblies which are axially oriented at a known angle with respect to each other, and which each contain at least a pair of substantially identical coils which have equal and opposite magnetic axes. Thus, there are at least four separate coils. The coils are electrically instrumented in an oscillator circuit whose frequency of oscillation is at least partially dependent upon the inductance in the coils. A switching network is connected to the coils and alternatingly allows current to flow through one of the at least four coils at a time. A processor then uses the frequencies of oscillation for each of the coils to calculate the geographic orientation of the compass. The substantially identical coils are created by simultaneously wrapping two wires adjacent each other about a bobbin or other cylindrical structure in a bifilar manner. This arrangement provides a simple, inexpensive compass which is substantially immune to temperature changes and permeability drifting.

DETAILED DESCRIPTION OF THE PRESENT INVENTION

Figure 1:
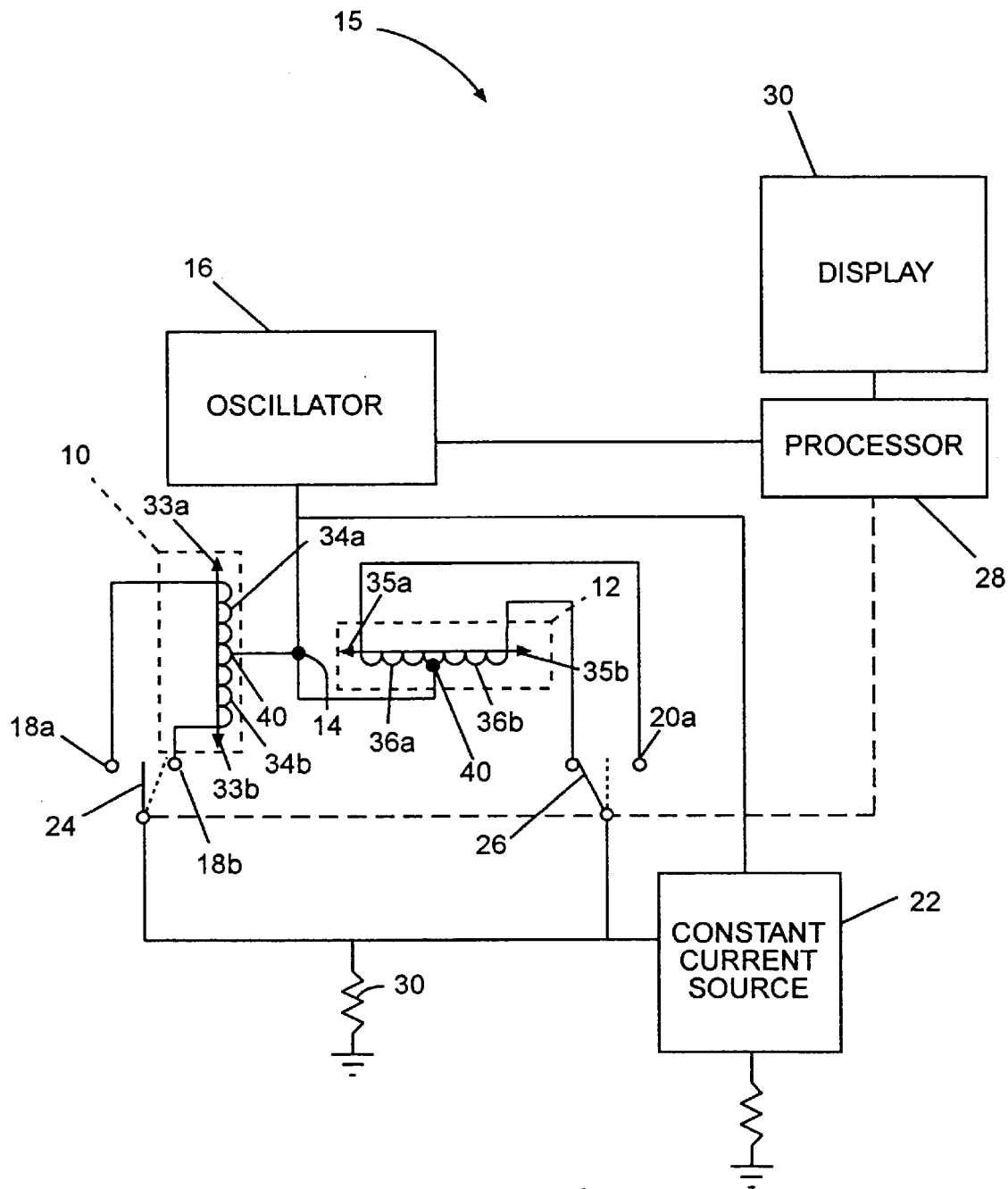
FIG. 1 is a block diagram of an electronic compass according to the present invention.

Referring now specifically to the drawings and the illustrative embodiments depicted therein, an electronic compass 15 includes a first coil assembly 10 having identical coils 34a and 34b which have generally parallel magnetic axes designated respectively 33a, 33b, and a second coil assembly 12 having substantially identical coils 36a and 36b which have generally parallel magnetic axes designated respectively 35a, 35b. Magnetic axes 35a and 35b are oriented at right angles to magnetic axes 35a and 35b. In the illustrated embodiment, the magnetic axes of each coil pair 34a and 34b are collinear and the magnetic axes of each coil pair 36a, 36b are collinear. First and second coil assemblies 10 and 12 can each be schematically represented as a single coil having a center tap 40 joined to a common node 14 which is electrically coupled to an oscillator 16. First coil assembly 10 further includes two terminals 18a and 18b which can be selectively coupled to a constant current source 22 by switch 24. Likewise, second coil assembly 12 has two terminals 20a and 20b which can be selectively coupled to constant current source 22 by switch 26. A processor 28 controls switches 24 and 26 so that constant current source 22 is alternatingly electrically coupled to a single one of the four terminals 18a, 18b, 20a, and 20b at any given time. Dotted lines at switches 24 and 26 indicate an alternate position for switches 24 and 26. Constant current source 22 delivers current through coil 34a, 34b, 36a, or 36b depending upon the position of switches 24 and 26. Oscillator 16 generates an alternating current (AC) signal having a frequency of oscillation substantially determined by the inductance and capacitance of the coils 34a, 34b, 36a, 36b connected with constant current source 22. The AC signal is superimposed on the direct current of constant current source 22. A resistive element 30 provides a voltage which is utilized by constant current source 22 to maintain a substantially constant current. Processor 28 receives an input from oscillator 16 and uses an algorithm based on the four frequencies of oscillation generated when each of coils 34a, 34b, 36a, 36b is coupled to constant current source 22 to determine geographic orientation. Processor 28 provides the calculated geographic orientation to display 30 where it is visually displayed. Visual display 30 may be a compass mirror of the type disclosed in commonly assigned U.S. Pat. No. 5,285,060 issued to Larson et al. for a Display for Automatic Rearview Mirror, the disclosure of which is hereby incorporated herein by reference.

Figure 2:
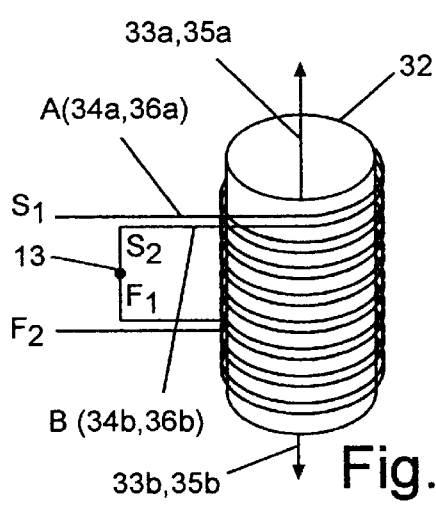
FIG. 2 is a perspective view of a coil assembly.

In a preferred embodiment, first and second coil assemblies 10 and 12 are each bifilar wound in order to form substantially identical coils 34a, 34b, and 36a, 36b. The bifilar windings of coil assemblies 10 and 12 are accomplished by simultaneously wrapping two wires A and B adjacent each other around a hollow core bobbin 32 or other cylindrical structure which, in the preferred embodiment, has a length of 1 inch and a diameter of 0.220 inches (FIG. 2). The wires are preferably insulated with either a polyester, a polyurethane, or a polyimide insulation. The simultaneous wrapping of wires A and B on bobbin 32 ensures that the electrical, physical, and magnetic characteristics of the coils formed by wires A and B are substantially identical. Wire A has a start end $S_1$ and finish end $F_1$ which define a coil A. Wire B has a start end $S_2$ which begins on an end of bobbin 32 adjacent to $S_1$ and which terminates at a finish end $F_2$, adjacent $F_1$, and thereby defines a coil B. The finish end of wire A($F_1$) and start end of wire B($S_2$) are joined together at a coupling point 13 which is connected with node 14. When current flows through wire A in the direction of start end $S_1$ to finish end $F_1$, a magnetic field is created, having a magnetic axis 33a, 35a in the center of coil A which points vertically upward as seen in FIG. 2. Due to the substantially identical properties of coil A and coil B, current flowing though coil B from finish end $F_2$ to start end $S_2$ creates a magnetic field having a magnetic axis 33b, 35b which is collinear with respective magnetic axes 33a, 35a but of opposite sense.

Figure 3:
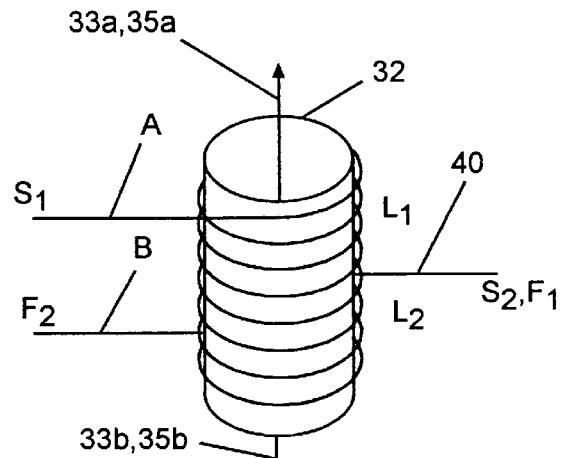
FIG. 3 is a perspective view of an equivalent representation of the coil assembly of FIG. 2.

Bifilar wound coils A and B of coil assemblies 10 and 12 can be equivalently represented by a coil having a precise center tap 40 (FIG. 3). In this equivalent representation coil A and coil B each occupy only one half of the axial length of bobbin 32 and center tap 40 corresponds to the coupling point 13 of finish end $F_1$ and start end $S_2$. Current flowing through coil A equivalently creates a magnetic field having magnetic axis 33a, 35a, and current flowing through coil B equivalently creates a magnetic field having an aligned but oppositely oriented magnetic axis 33b, 35b. While this representation does not explicitly depict the preferred bifilar winding nature of coil assemblies 10 and 12, it will be used as a more analytical way to represent coil assemblies 10 and 12 in FIGS. 1, 3, and 4, with the understanding that the actual physical structure of coil assemblies 10 and 12 is preferably that depicted in FIG. 2.

Coils A and B of coil assemblies 10 and 12 have inductances $L_1$ and $L_2$ which, due to the substantially identical electrical, physical, and magnetic characteristics of the two coils, are $$L = N^2 \mu_R \mu_0 A / 1 \quad (1)$$

equal when no core material is present in the coils. The inductance of coils A and B without a core material present can be expressed by the following equation:

where N=number of turns of wire;

$\mu_0$=permeability of free space=$4\pi = 10^{-7}$ Henries/meter;

$\mu_R$=relative permeability of the core material ($\mu_R$=1 for free space);

1=axial length of coil in meters; and

A=cross sectional area of coil in square meters.

Figure 4:
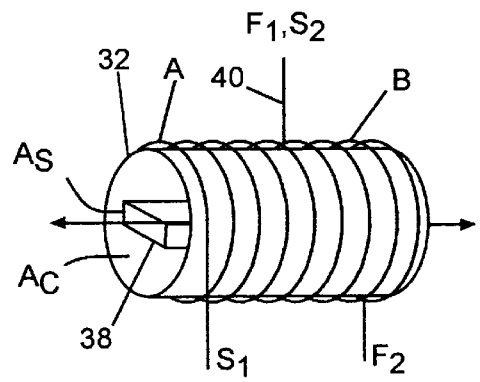
FIG. 4 is a perspective view of a coil assembly equivalent shown with the core material inserted.

Because the relative permeability of free space is not dependent upon an external magnetic field but remains constant, the above equation reveals that the inductance in coils A and B of coil assemblies 10 and 12 will not, when coreless, vary as electronic compass 15 is rotated 360° in the presence of the Earth's magnetic field. Rather, for the inductance in coil assemblies 10 and 12 to be dependent upon the orientation of compass 15 with respect to magnetic north, a material must be used as a core for coil assemblies 10 and 12 which has a permeability dependent upon its orientation in the presence of an external magnetic field. A core material 38 having a high DC permeability provides just such a material and is inserted into coil assemblies 10 and 12 (FIG. 4). In the preferred embodiment, core material 38 is METGLAS Magnetic Alloy 2705M, sold by Allied Signal, Inc., Parsippany, N.J., and is a cobalt based alloy having a DC permeability of at least 80,000 although other core materials can be used. Also, in the preferred embodiment, core material 38 is 1.00 inch long, 0.082 inch wide by 0.0009 inch thick and is placed lengthwise inside the hollow core of bobbin 32 although other configurations are possible.

The effect of core 38 upon the inductance in coils A and B in coil assemblies 10 and 12 will depend upon the cross-sectional area ($A_S$), length (1), and permeability ($\mu$) of core 38, along with the ratio of the cross-sectional area of core 38 to the cross-sectional area of coil assemblies 10 or 12 ($A_S/A_C$). Because the cross-sectional area ($A_S$), length (1), and ratio ($A_S/A_C$) will be constant, the inductance of coils A and B of coil assemblies 10 and 12 will vary only with changes in the permeability of core material 38. Thus if $\mu_E$ is designated as the effective permeability of coils A and B of coil assemblies 10 and 12 when core 38 is inserted, then an expression for $\mu_E$ can be written as follows $$\mu_E = k \mu_R \mu_0 \quad (2)$$

where k=a proportionality constant based on $A_S$, 1, and $A_S/A_C$; and $\mu_R$=relative permeability of the core material.

Equation (1) above can therefore be rewritten as:

$$L = N^2 \mu_E A / 1 \quad (3)$$

The permeability of core 38 ($\mu$) is further dependent upon the strength of an externally applied magnetic field. The permeability of core 38 can therefore be expressed as a function of H:

$$\mu = f(H) \quad (4)$$

Figure 5:
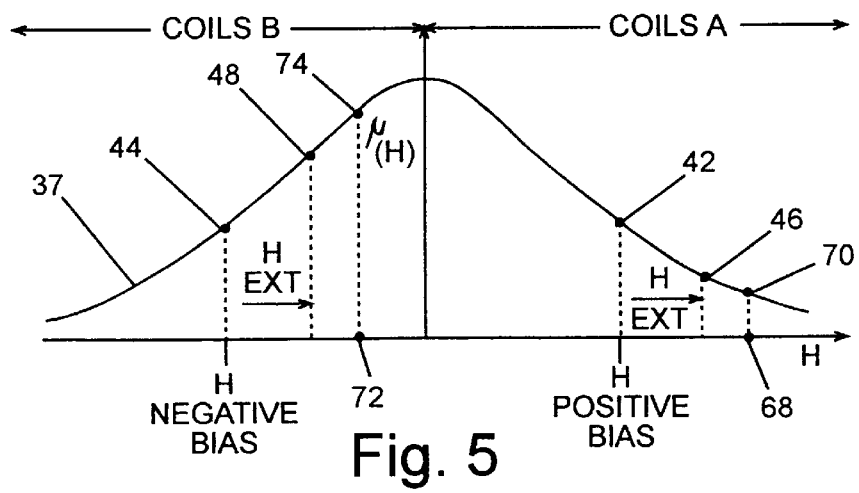
FIG. 5 is a graph of a permeability curve of the core material with respect to the magnetic field strength.

A permeability curve 37 depicts a graph of this function of the permeability of core 38 with respect to magnetic field strength H of an external magnetic field (FIG. 5). The permeability of core 38 is at a maximum when no external magnetic field is applied and decreases therefrom as ever increasing magnetic fields are applied in either direction. The permeability varies in a generally inverse manner with respect to magnetic fields having positive values, and in a generally direct manner with respect to magnetic fields having negative values. It should be noted that there is a mirror symmetry about the vertical permeability axis of permeability curve 37, so that the permeability of core 38 responds in substantially the same manner whether the applied magnetic field is positive or negative. Constant current source 22 induces a bias current through coil A of first coil assembly 10 from $S_1$ to $F_1$ thereby creating a magnetic field. This magnetic field will alter the permeability of core material 38 to that defined by positive bias point 42 (FIG. 5). Upon switching of switch 24 from terminal 18a to 18b, current from constant current source 22 is induced in coil B of first coil assembly 10 from $F_2$ to $S_1$ thereby creating a different magnetic field which will be oppositely oriented. The current flowing through coil B of first coil assembly 10 is equal to the current that flowed through coil A of first coil assembly 10, and the permeability of core material 38 will be changed to that defined at negative bias point 44. The permeability of core material 38 at positive bias point 42 is equal to the permeability of core material 38 at negative bias point 44 due to the symmetry of permeability curve 37 of core material 38. In the presence of an externally applied magnetic field, such as the Earth's, positive bias point 42 and negative bias point 44 will shift to operating points 46 and 48 respectively. The precise location of operating points 46 and 48 on permeability curve 37 will vary according to the magnitude and direction of the Earth's magnetic field with respect to the compass. At one orientation of electronic compass 15, operating points 46 and 48 will correspond to points 70 and 74, respectively, as will be discussed later. When switch 26 is activated, current will flow through either coil A or B in coil assembly 12 which will similarly generate a positive and negative bias point for core material 38 in coil assembly 12, and the presence of an external magnetic field will change the permeability to direction varying operating points.

Figure 6:
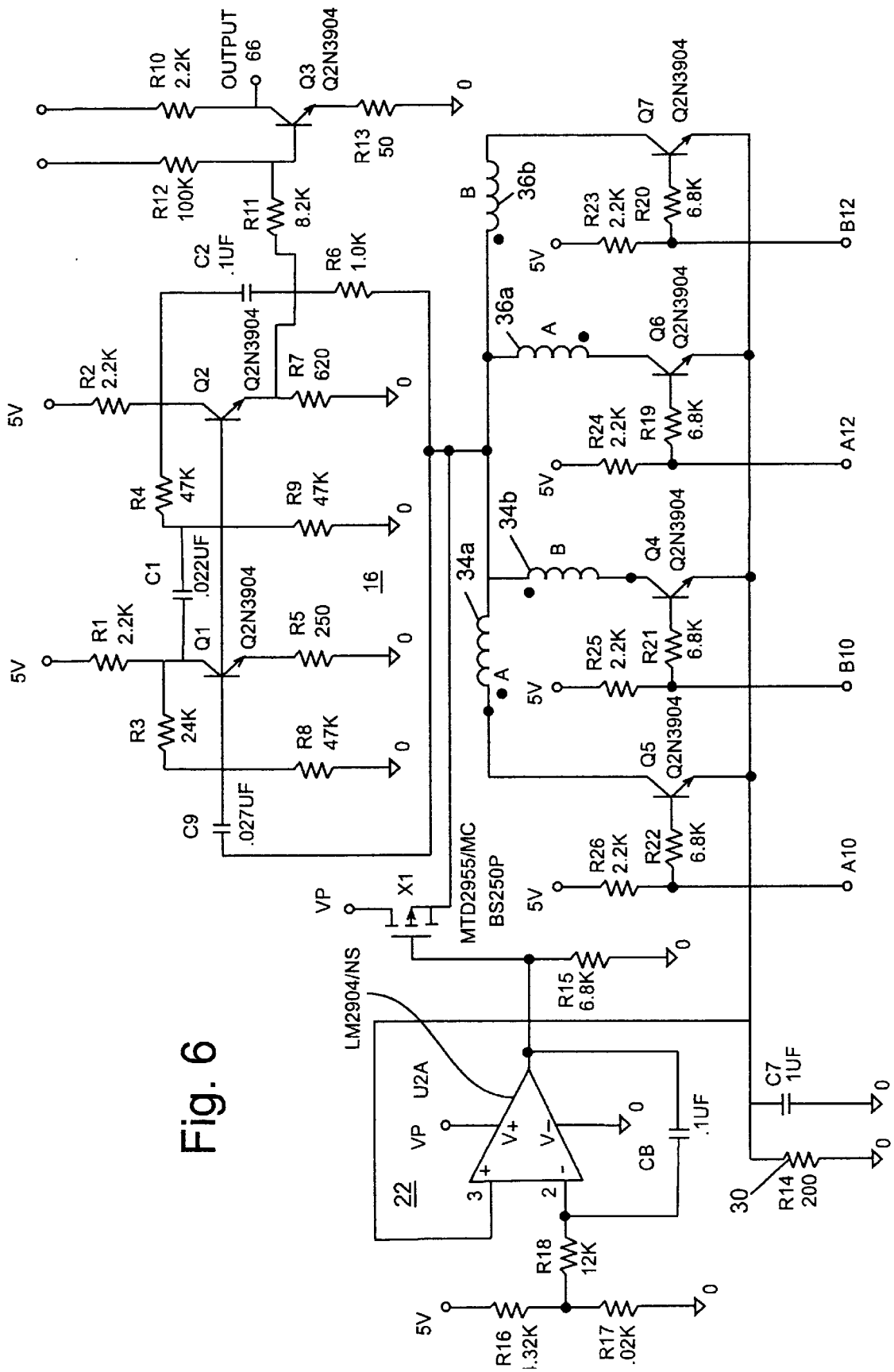
FIG. 6 is a detailed schematic of the preferred embodiment.

The bifilar windings of coils 34a, 34b of coil assembly 10 and coils 36a, 36b of coil assembly 12 create an interwinding capacitance C which, in combination with the inductance L of coil assemblies 10 and 12, largely determine the frequency of oscillation of oscillator 16. Oscillator 16 is an LC feedback oscillator having a gain element which consists of two cascaded stages of amplification provided by transistors Q1 and Q2 (FIG. 6). A buffer and signal conditioning transistor Q3 provides processor 28 with a suitable signal at an output 66 for analysis for computing the geographic orientation of electronic compass 15. Oscillator 16 is alternatingly coupled to one of coils A or B of coil assemblies 10 or 12 by switches 24 and 26. Switches 24 and 26 each consist of two NPN transistors Q4–Q7 coupled to pull-up resistors R23–R27 which ensure a 5 volt rail for transistors Q4–Q7. The base of each transistor Q4–Q7 is driven by a 5 volt DC signal from processor 28 which is coupled to respective inputs A10, B10, A12, and B12. The 5 volt DC signal from processor 28 alternatingly drives one of the four transistors Q4–Q7 into saturation, allowing AC current and DC bias current to flow through one of coils A or B of coil assemblies 10 or 12. The AC current flows to ground via bypass capacitor C7. The DC current flows through R14 establishing a sense voltage utilized by constant current source 22.

Constant current source 22 serves as the coil bias current source for electronic compass 15 and operates according to an electronic servo technique well known in the art. Another power source (not shown) provides the 5 volt rail and otherwise powers the other circuiting. Constant current source 22 includes as active elements an operational amplifier U2A and a "P" channel MOSFET transistor X1. Sense voltage at resistor 30 is fed back to the noninverting input of operational amplifier U2A. Subsequently, the voltage at resistor 30 is servoed to a reference voltage established by resistors R16 and R17. The source of the MOSFET X1 will adjust itself to maintain the voltage at R14 equal to the reference voltage established by R16 and R17. Thus changes in coil resistance or switch voltage drops are compensated for in the operation of electronic compass 15. A constant current source is preferably used as the coil bias current source for electronic compass 15 because it does not affect the AC performance of compass 15. Specifically, the current remains constant over a wide range of temperatures, thus significantly mitigating the difficulty which prior art compasses have had in accurately operating over wide temperature fluctuations. Moreover, a "P" channel MOSFET is preferable in constant current source 22 because its intrinsic characteristics do not change as significantly with temperature as a bipolar junction transistor would, although such a bipolar transistor could be used. Additionally, the use of a MOSFET does not create as great an AC loading effect on coils A and B of coil assemblies 10 and 12 as would a bipolar junction transistor.

Figure 7A:
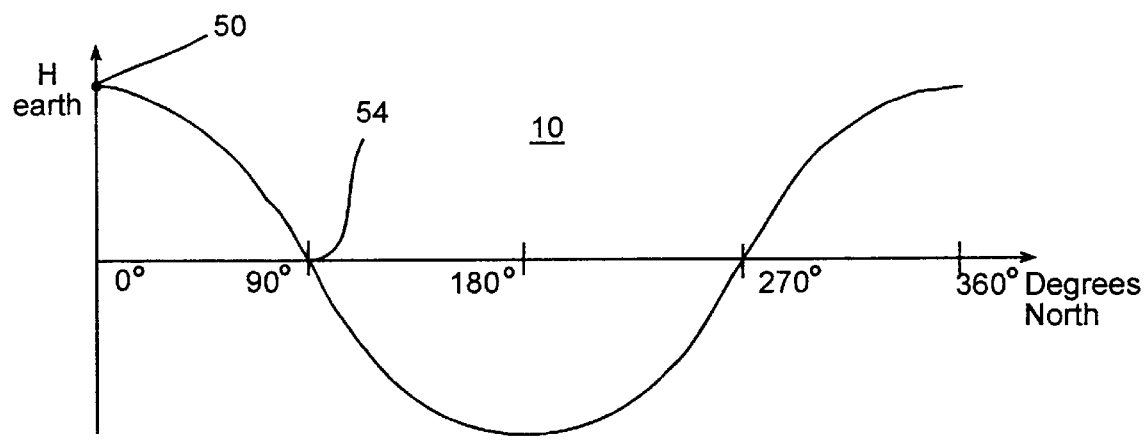
FIGS. 7a and 7b are graphs of the northerly component of the Earth's magnetic field sensed by coil assemblies 10 and 12 when rotated 360° in the Earth's magnetic field.
Figure 7B:
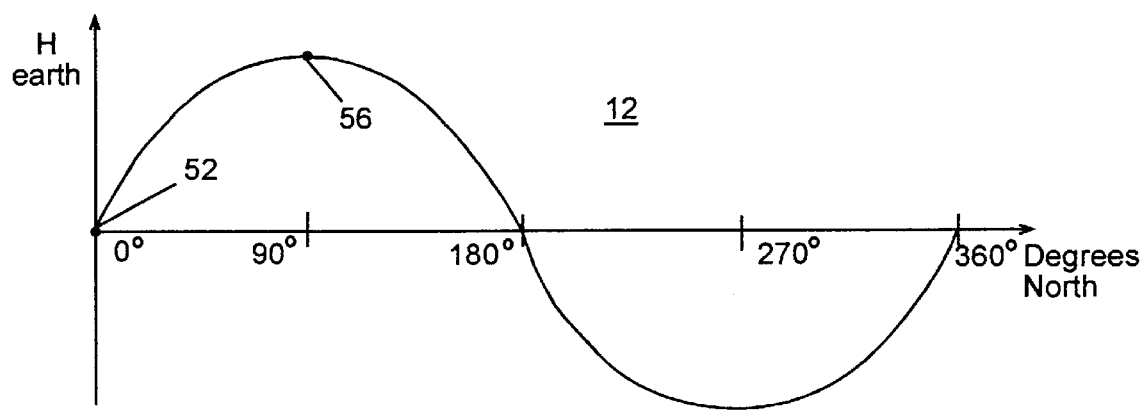

As electronic compass 15 is rotated 360°, the northerly component of the Earth's magnetic field as measured in the direction of magnetic axis 34a of coil assembly 10 or magnetic axis 36a of coil assembly 12 will vary in a sinusoidal fashion as illustrated in FIGS. 7a and 7b. If electronic compass 15 is initially oriented with magnetic axis 34a of coil assembly 10 pointed directly north, then the strength of the Earth's magnetic field that will be sensed by coil A of coil assembly 10 will be at a maximum point 50 (FIG. 7a). At this same orientation the magnetic axes 36a and 36b of coil assembly 12 will be pointing directly west and east, respectively, since coil assembly 12 is oriented at a 90° angle with respect to coil assembly 10. Therefore, coil A of coil assembly 12, which points directly west, will sense no northerly component of the Earth's magnetic field as is designated by zero point 52. The magnetic field strength of the northerly component of the Earth's magnetic field that will be sensed using coils B of coil assemblies 10 and 12 will likewise be sinusoidally varying, but will be 180° out of phase with respect to coils A of coil assemblies 10 and 12 (not shown). When electronic compass 15 has been rotated 90° clockwise the northerly component of the Earth's magnetic field that will be sensed using coil A of coil assembly 10 will be zero and is designated as zero point 54. At this 90° orientation, coil A of coil assembly 12 will be pointing directly north and will sense a maximum northerly component of the Earth's magnetic field as designated by maximum point 56. As electronic compass 15 is further rotated through a complete revolution, the magnetic field strength sensed using coil A of coil assembly 10 will generate one complete cycle of a sine wave. Coil A of coil assembly 12 will further generate one complete cycle of a cosine wave.

The frequency of oscillation of oscillator 16 can be expressed approximately as:

$$F = \frac{1}{2\pi\sqrt{LC}} \quad (5)$$

where L=inductance in the coil through which current is flowing; and

C=capacitance. This may be the capacitance in the coil through which current is flowing or may include the capacitance of a discrente capacitor CD. By combining equations 3 and 4 with equation 5, an expression for the frequency can be written as:

$$F = \frac{1}{2\pi\sqrt{CN^2 A\mu(H)/l}} \quad (6)$$

An examination of permeability curve 37 reveals that it has the general shape of a function defined as:

$$f(H)=H^{-n} \quad (7)$$

where n is an even integer. This approximation is especially accurate in the regions away from H=O. In fact, if electronic compass 15 is operated in a region of permeability curve 37 where the shape of permeability curve 37 can be characterized predominately by equation 7 with n=2, then $\mu$(H) can be expressed as:

$$\mu(H)=H^{-2} \quad (8)$$

and therefore, in this region, f=KH where $$K = \frac{1}{2\pi\sqrt{CN^2 A/l}}.$$

Figure 8:
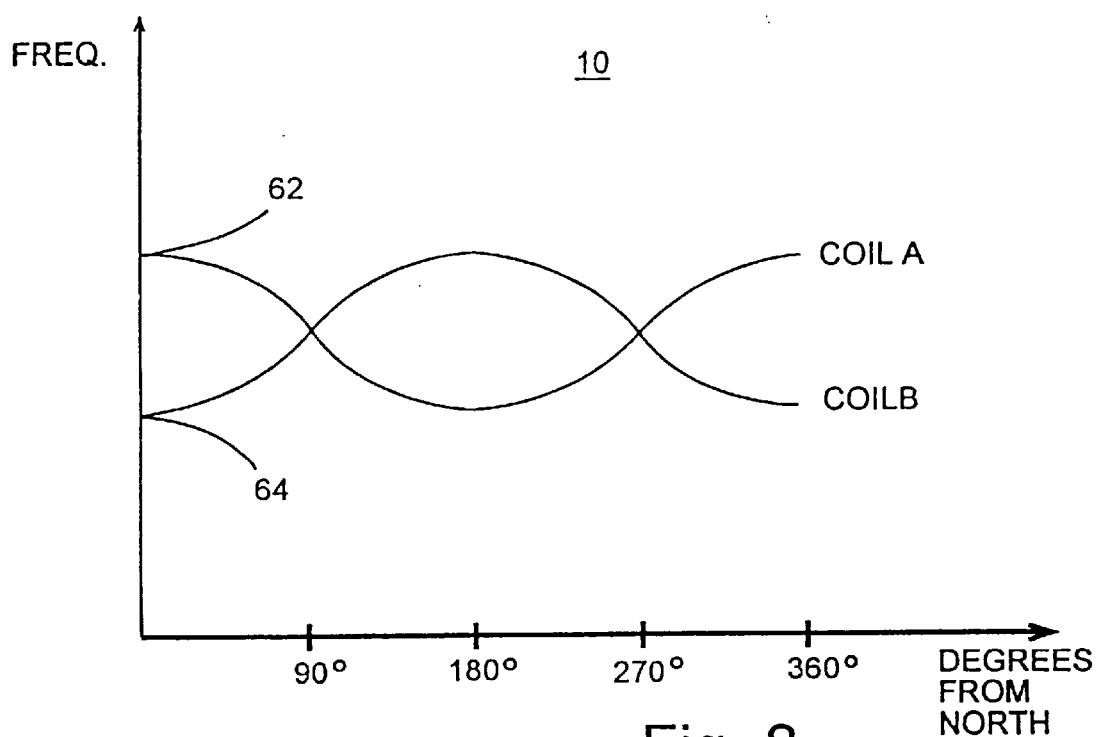
FIG. 8 is a graph of the frequency of oscillation of coil assembly 10 when rotated 360° in a magnetic field.
Figure 9:
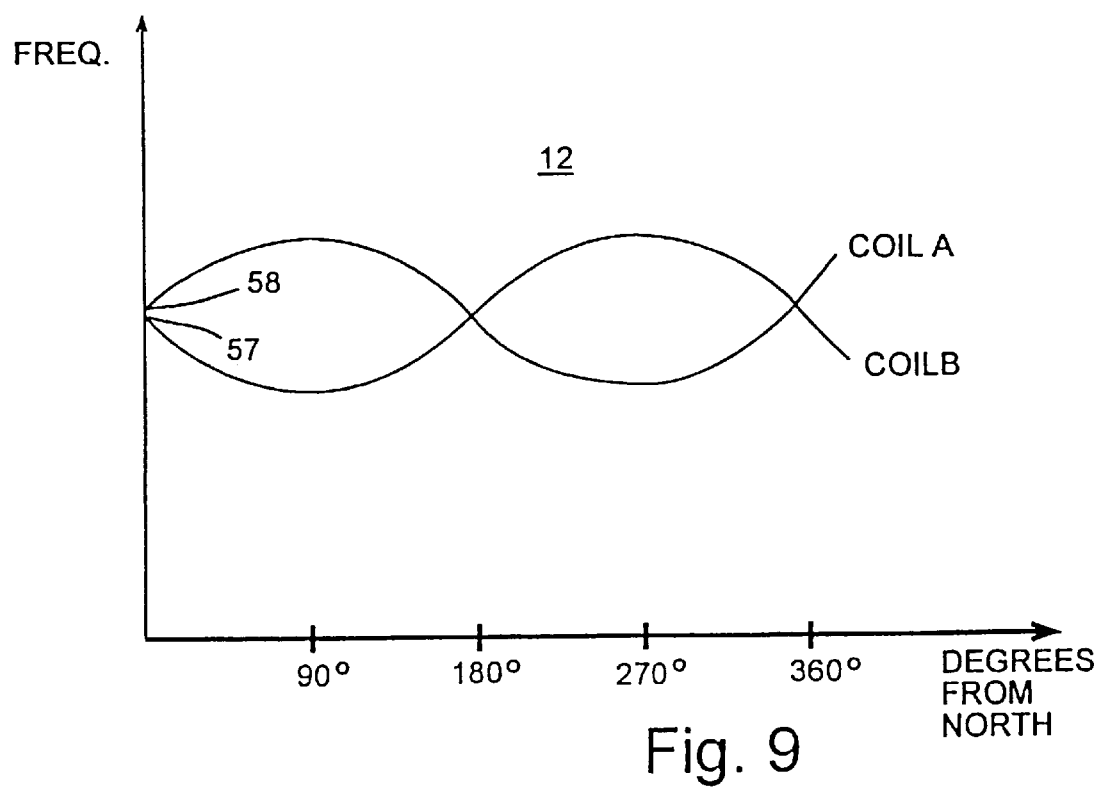
FIG. 9 is a graph of the frequency of oscillation of coil assembly 12 when rotated 360° in a magnetic field.

Thus the frequency of oscillation of oscillator 16 is directly proportional to the permeability of core 38 when the bias points 42 and 44 are chosen so electronic compass 15 operates in this region. A graph of the frequency of oscillation of compass 15 as it is rotated through 360° will thus have the same shape as the graph of FIGS. 7a, 7b, only shifted by a constant factor K (FIGS. 8 and 9).

Figure 10:
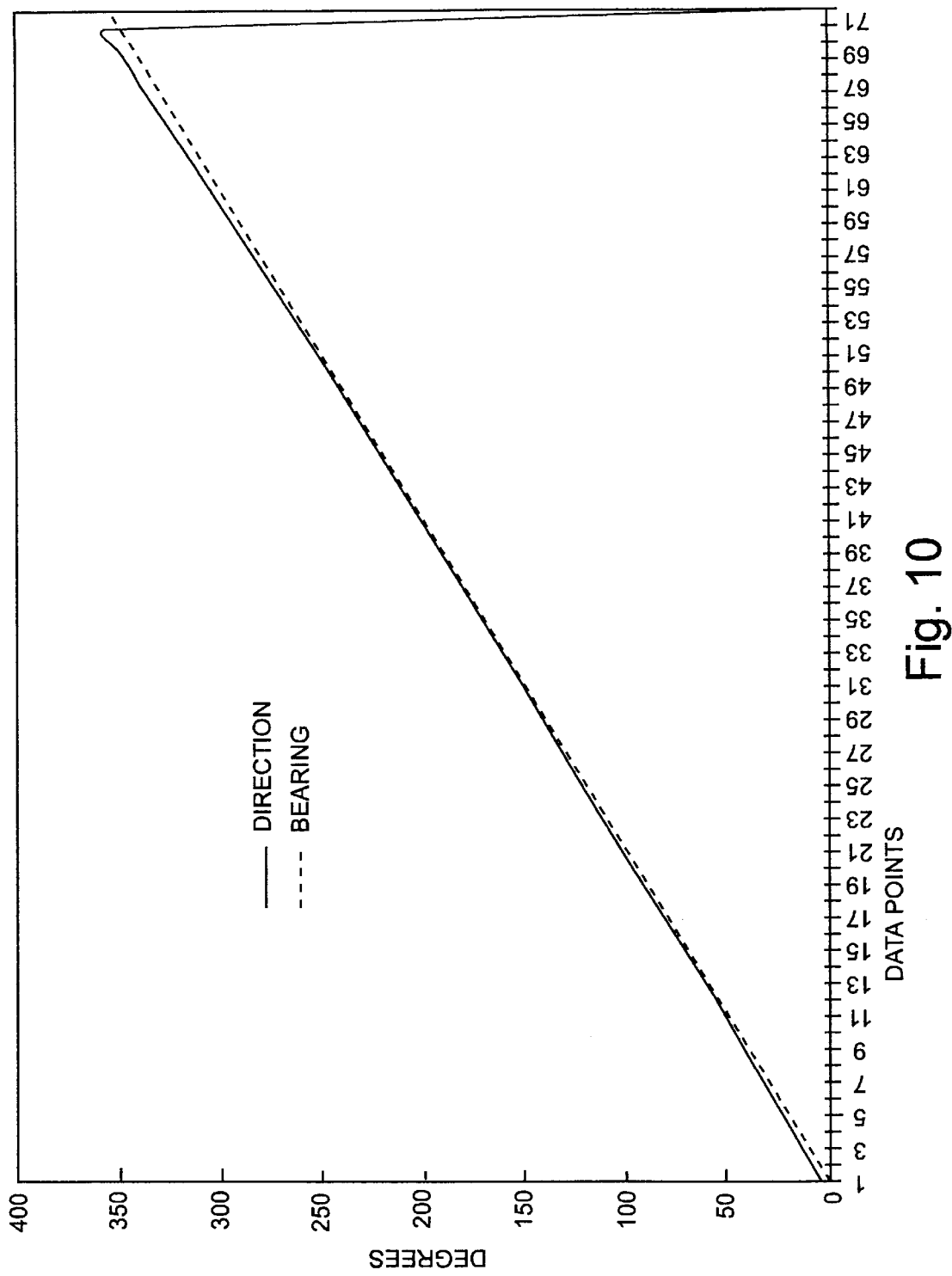
FIG. 10 is a graph of the results of a series of tests performed on a prototype where a simulated car's magnetic signature of 650 milligauss was superimposed on the rotating Earth magnetic field of 250 milligauss at a temperature of −40° C.

Nine series of tests were performed on a prototype model of electronic compass 15 at different temperatures which confirms the near linearity of the relationship between calculated bearing and actual heading (FIG. 10). The electronic compass 15 was held steady in a fixed orientation while a Helmholtz coil was used to simulate the Earth's magnetic field and changes in orientation with respect to it. The angle of orientation of the prototype was plotted on the X-axis in five degree increments entitled "data points" (i.e. data point 60 corresponds to 300° (60×5=300)), while the bearing output of the prototype was plotted on the Y-axis. The bearing is calculated from the arctangent of the heading angles measured by each of the coils 10 and 12. The heading angles for each coil were measured as the difference in oscillator frequency with each coil A and B alternatively energized. No algorithmic linearization techniques were employed. The resulting relationship for all nine series of test runs was exceptionally linear as can be seen by observing the Y curves in FIG. 10–18.

When electronic compass 15 is pointing directly north, the northerly component of the Earth's magnetic field sensed by coil A of coil assembly 10 will be at maximum point 50. Because the northerly component of the Earth's field is aligned with the magnetic field produced by the bias current in coil A of coil assembly 10, the addition of these two magnetic fields will yield a maximum magnetic field having a strength designated by point 68 (FIG. 5). At point 68, the permeability of core 38 will be at a minimum point 70 so the frequency of oscillation will be at a maximum, designated as point 64 (FIG. 8). Coil B of coil assembly 10, will have the magnetic field produced by its bias current reduced by the Earth's magnetic field because it is oppositely oriented, and the resulting strength of the magnetic field is designated as point 72 (FIG. 5). At point 72, the permeability of core 38 will be at a maximum, designated as point 74, so the frequency of oscillation will be at a minimum, designated as point 62 (FIG. 8). The frequencies of oscillation in coils A and B of coil assembly 12 will be the positive and negative bias frequencies 57 and 58 established by the direct current bias since these coils are pointed east and west in this orientation. Because the bias currents are the same and because permeability curve 37 is symmetric, bias frequencies 57 and 58 will be equal (in the absence of an ambient, non-Earth magnetic field, such as an automobiles). As electronic compass 15 is rotated 360°, the frequencies of oscillation in each of coils A and B of coil assemblies 10 and 12 will vary according to FIGS. 8 and 9.

Before electronic compass 15 can reliably operate in an environment having an ambient, substantially static magnetic field in addition to the Earth's magnetic field, such as in or around an automobile, it must be calibrated. A calibration step 88 consists of rotating the compass 15 in a circle while a series of measurements of the frequencies of oscillation using coils 34a, 34b, 36a, and 36b are taken in increments by processor 28 and stored. This stored data is used in algorithm 64 to remove the influence of the automobile's magnetic field when computing geographic orientation as will be more fully discussed below. For each incremental fraction of rotation of electronic compass 15 during the calibration step 88, output 66 of electronic compass (FIG. 6) sends frequency information to processor 28 which computes the frequency of oscillation of oscillator 16 using coil A and coil B of coil assembly 10 and coil A and coil B of coil assembly 12. Specifically, a frequency $F_{x1}$ using coil 34a is measured and a frequency $F_{x2}$ using coil 34b is measured and then subtracted from frequency $F_{x1}$ yielding a difference $\Delta F_x$. At the same orientation, a frequency $F_{y1}$ using coil 36a is measured and a frequency $F_{y2}$ using coil 36b is measured and then subtracted from frequency $F_{y1}$ yielding a difference $\Delta F_y$. These measurements are repeated for every incremental orientation of compass 15 as it is rotated 360° in the calibration step. Processor 28 compares all the values of $\Delta F_x$ and $\Delta F_y$ in the series of values generated in the 360° rotation of the calibration step and determines the maximum $\Delta F_x$ ($\Delta F_{xmax}$), the maximum $\Delta f_y$ ($\Delta F_{ymax}$), the minimum $\Delta F_x$ ($\Delta F_{xmin}$), and the minimum $\Delta f_y$ ($\Delta F_{ymin}$). These values are stored by processor 28 and are used in algorithm 64 to separate the influence of the magnetic field of an automobile on compass 15 as described more fully below.

Automotive vehicles generally produce magnetic fields of their own which have a higher flux density in and near the auto than does the Earth's magnetic field. Therefore, in order for electronic compass 15 to operate accurately, this influence must be separated from that produced by the Earth's magnetic field. Unlike the Earth's magnetic field, though, the automobile's magnetic field will remain substantially in a fixed orientation with respect to the automobile. Thus, so long as electronic compass 15 does not change its orientation with respect to the automobile's magnetic field, the effect of the automobile's magnetic field on compass 15 will not vary as the automobile changes its geographic orientation. The effect of the automobile's magnetic field will be to shift the curves in FIGS. 8 and 9 upward or downward an amount which depends upon the orientation and strength of the automobile's magnetic field. The influence of the automobile's magnetic field on the frequency of coils A and B coil assembly 10 ($F_{a10}$) can be expressed as:

$$F_{a10}=(\Delta F_{xmax}+\Delta F_{xmin})/2 \qquad (9)$$

Likewise, the influence of the automobile's magnetic field on the frequency of coils A and B of coil assembly 12 ($F_{a12}$) can be expressed as:

$$F_{a12}=(\Delta F_{ymax}+\Delta F_{ymin})2 \qquad (10)$$

As will be described in more detail below, processor 28 computes the values $F_{a10}$ and $F_{a12}$ during calibration step 88 in accordance with algorithm 64.

Figure 11:
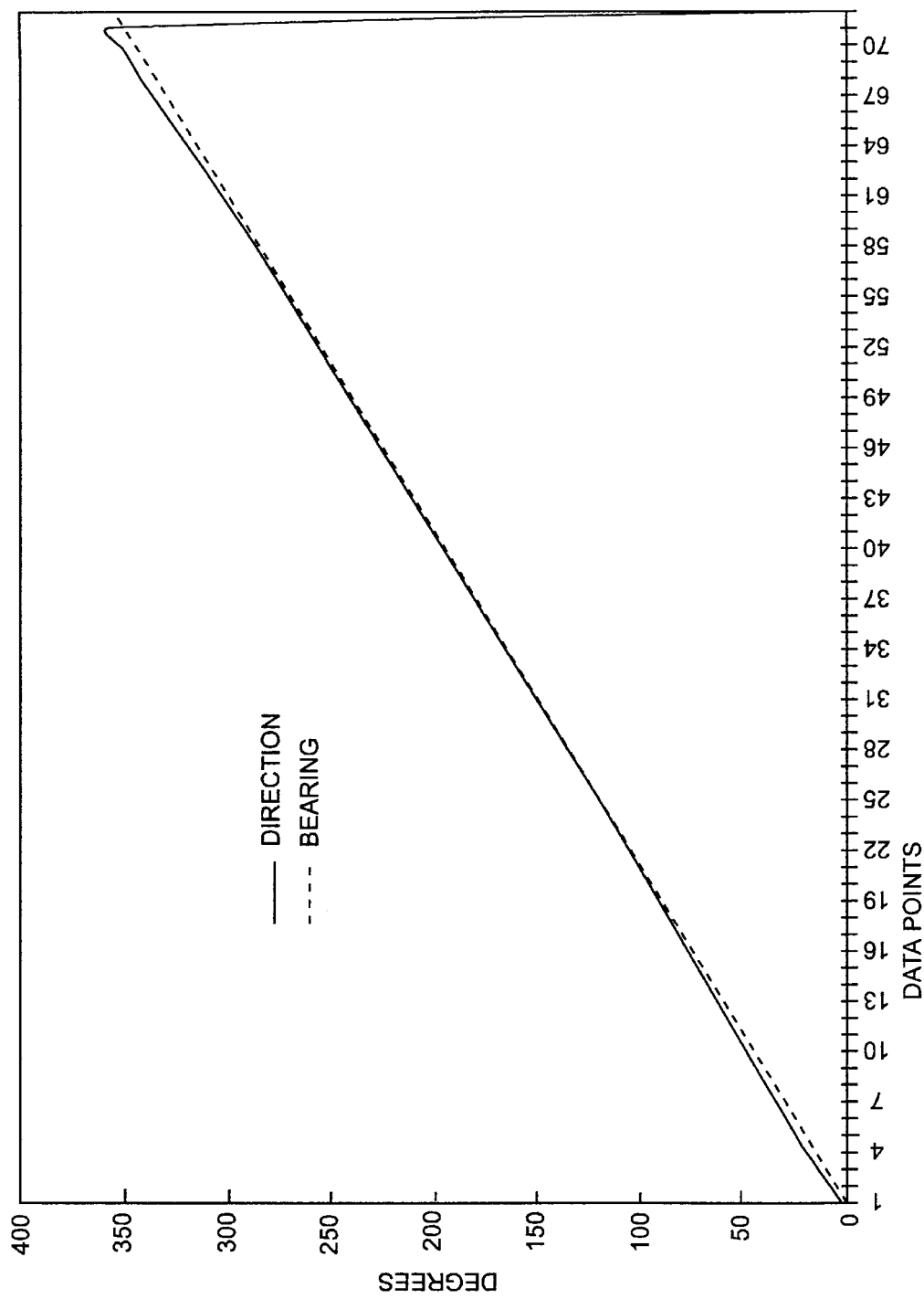
FIG. 11 is a graph of the results of the tests performed for FIG. 10 at a temperature of −30° C.
Figure 12:
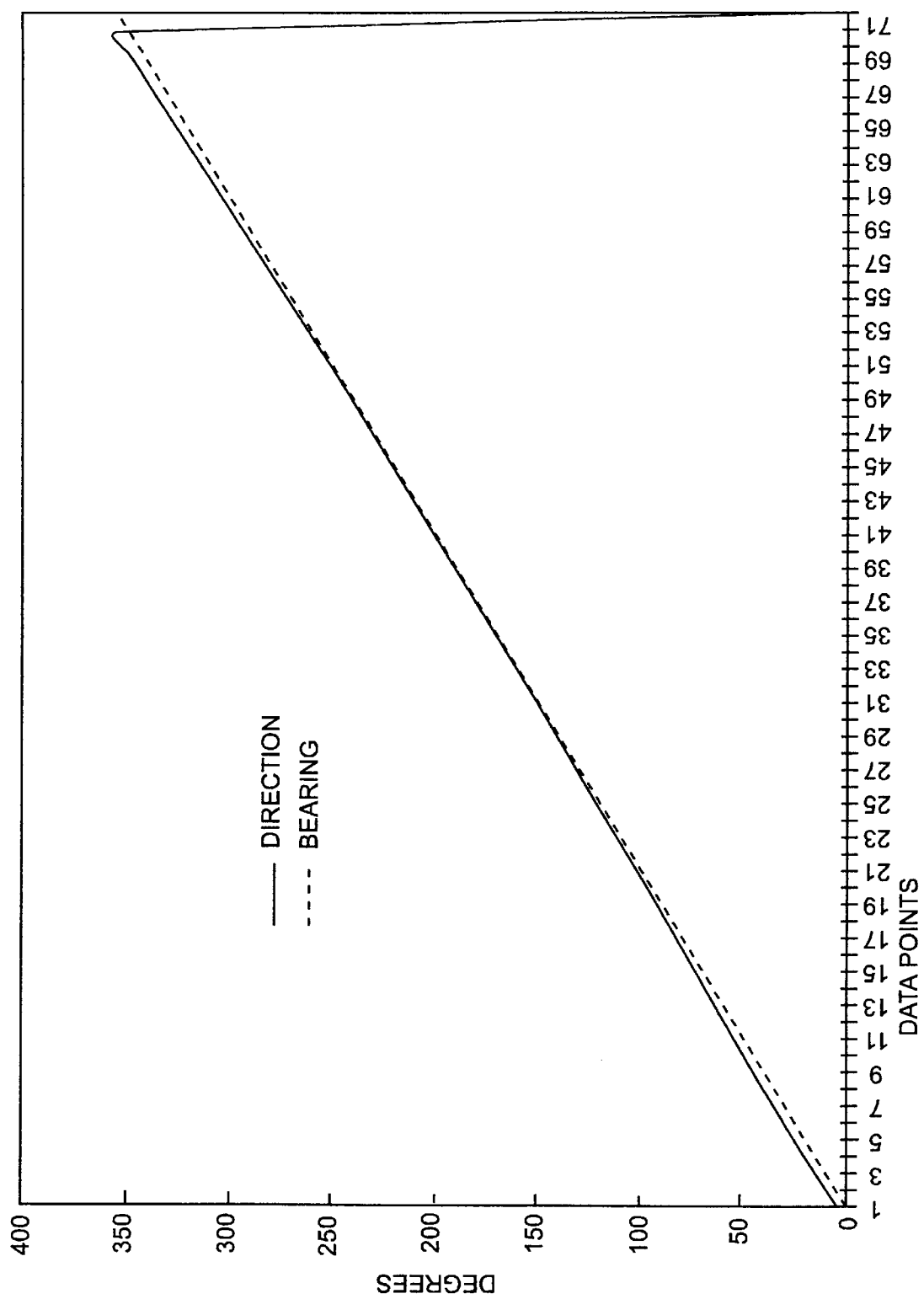
FIG. 12 is a graph of the results of the tests performed for FIG. 10 at a temperature of −20° C.
Figure 13:
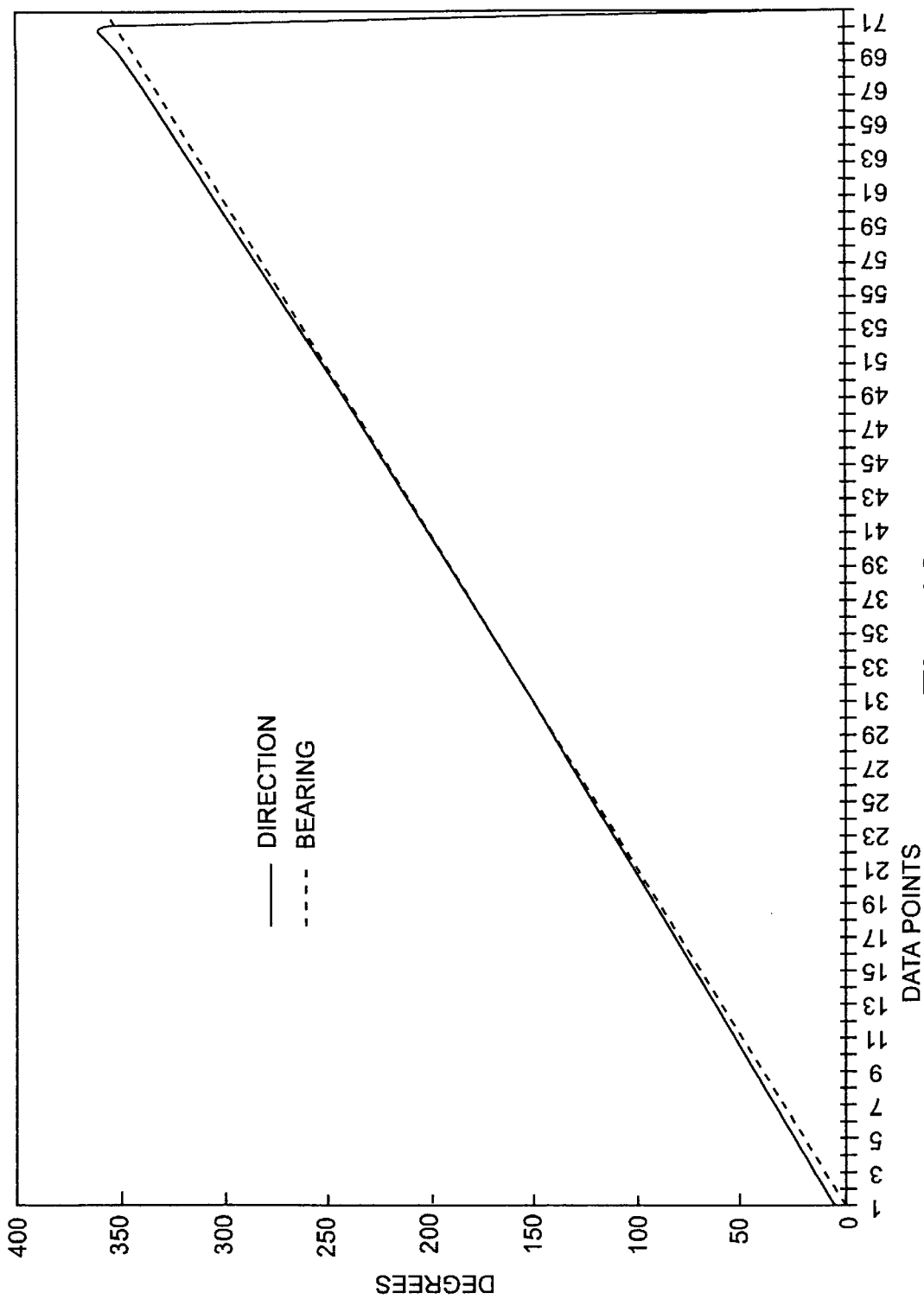
FIG. 13 is a graph of the results of the tests performed for FIG. 10 at a temperature of −10° C.
Figure 14:
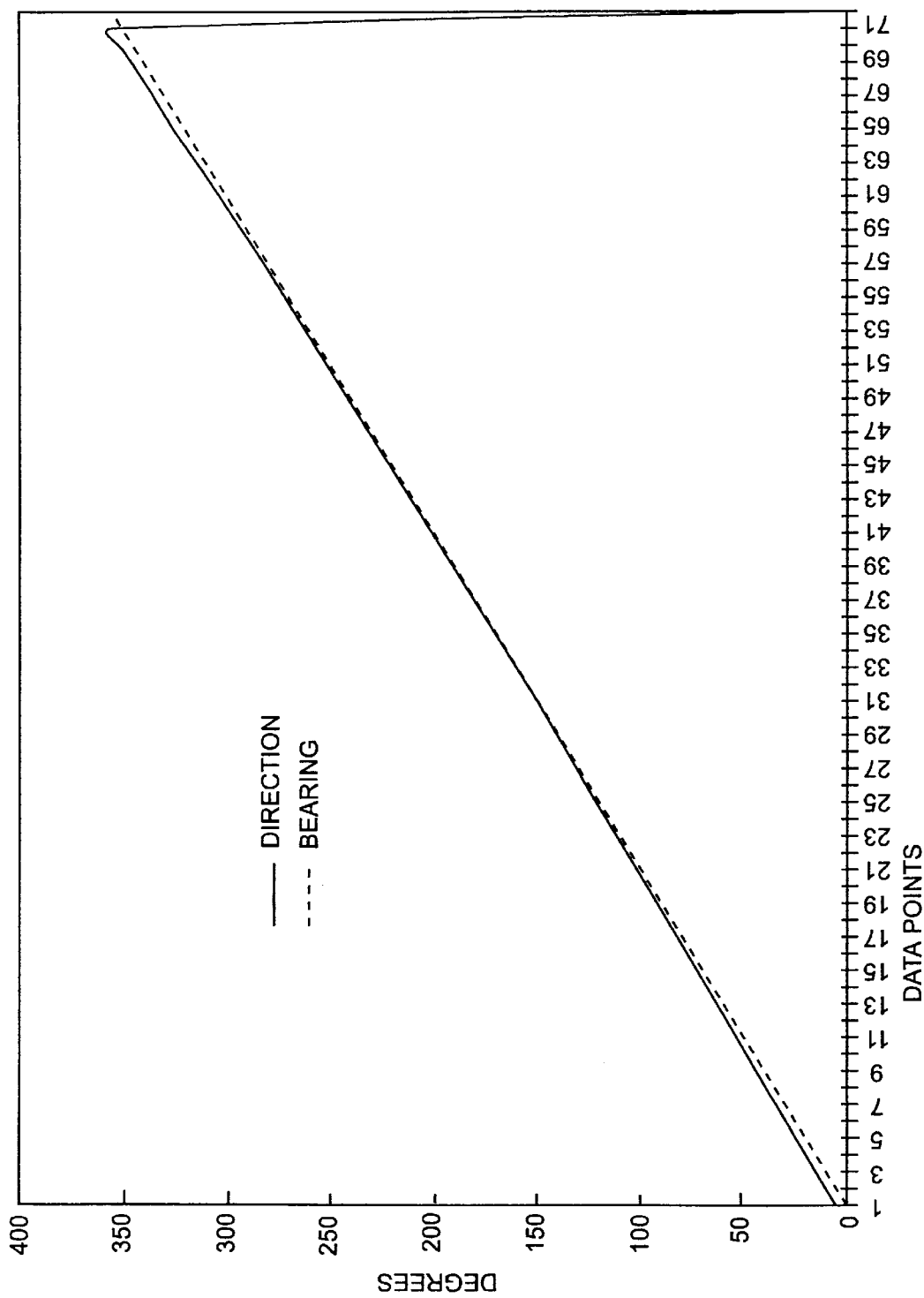
FIG. 14 is a graph of the results of the tests performed for FIG. 10 at a temperature of 0° C.
Figure 15:
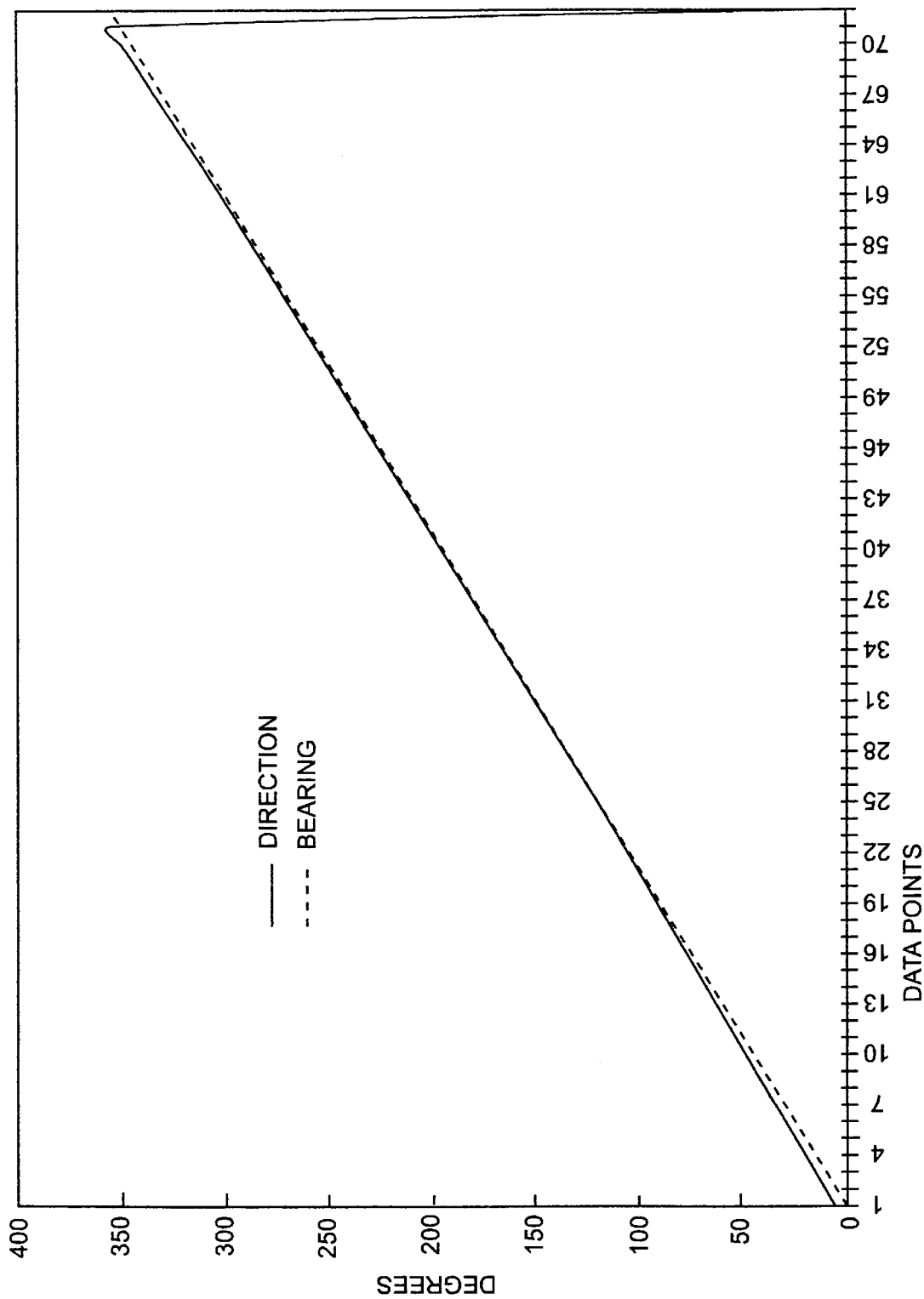
FIG. 15 is a graph of the results of the tests performed for FIG. 10 at a temperature of 25° C.
Figure 16:
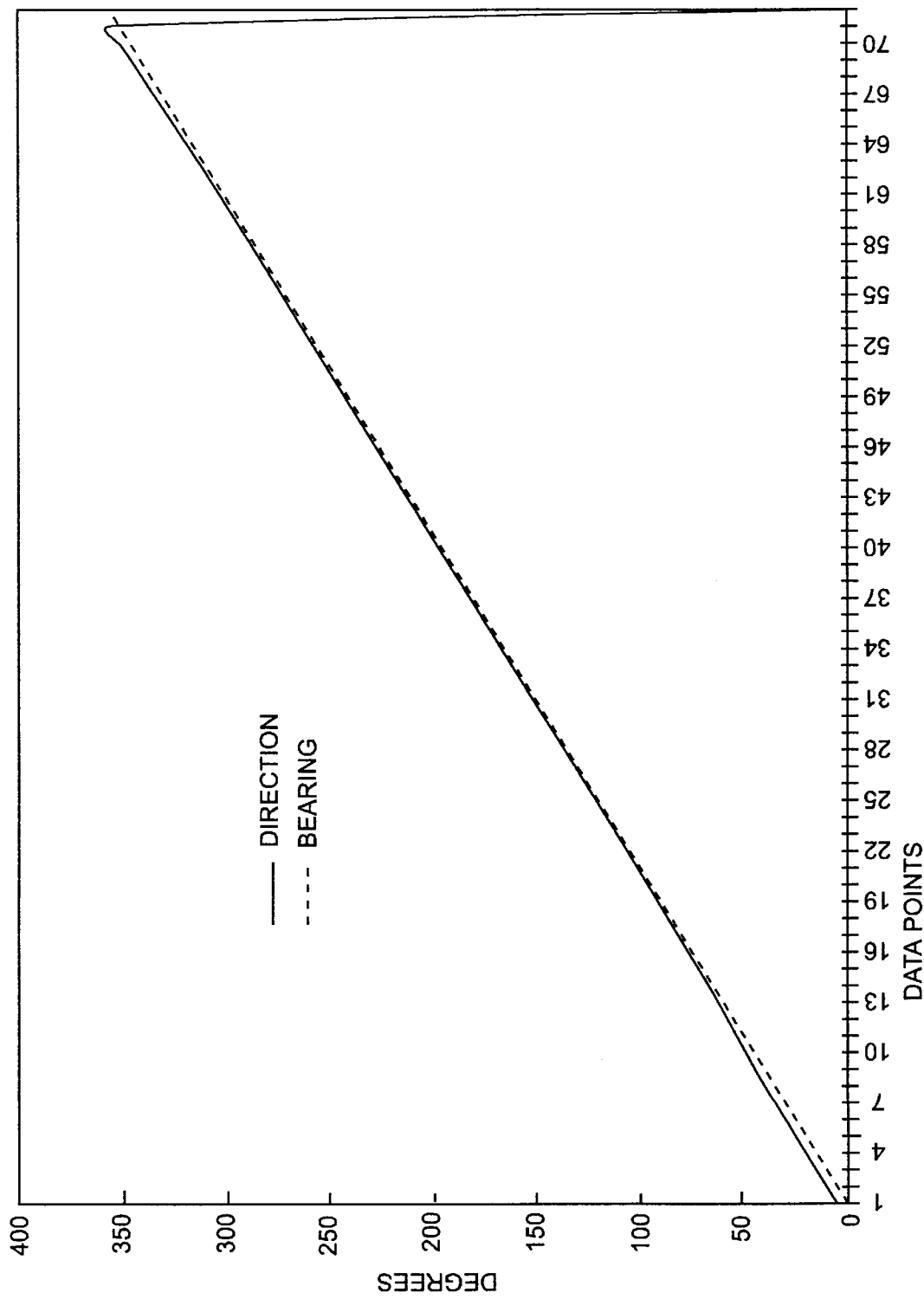
FIG. 16 is a graph of the results of the tests performed for FIG. 10 at a temperature of 40° C.
Figure 17:
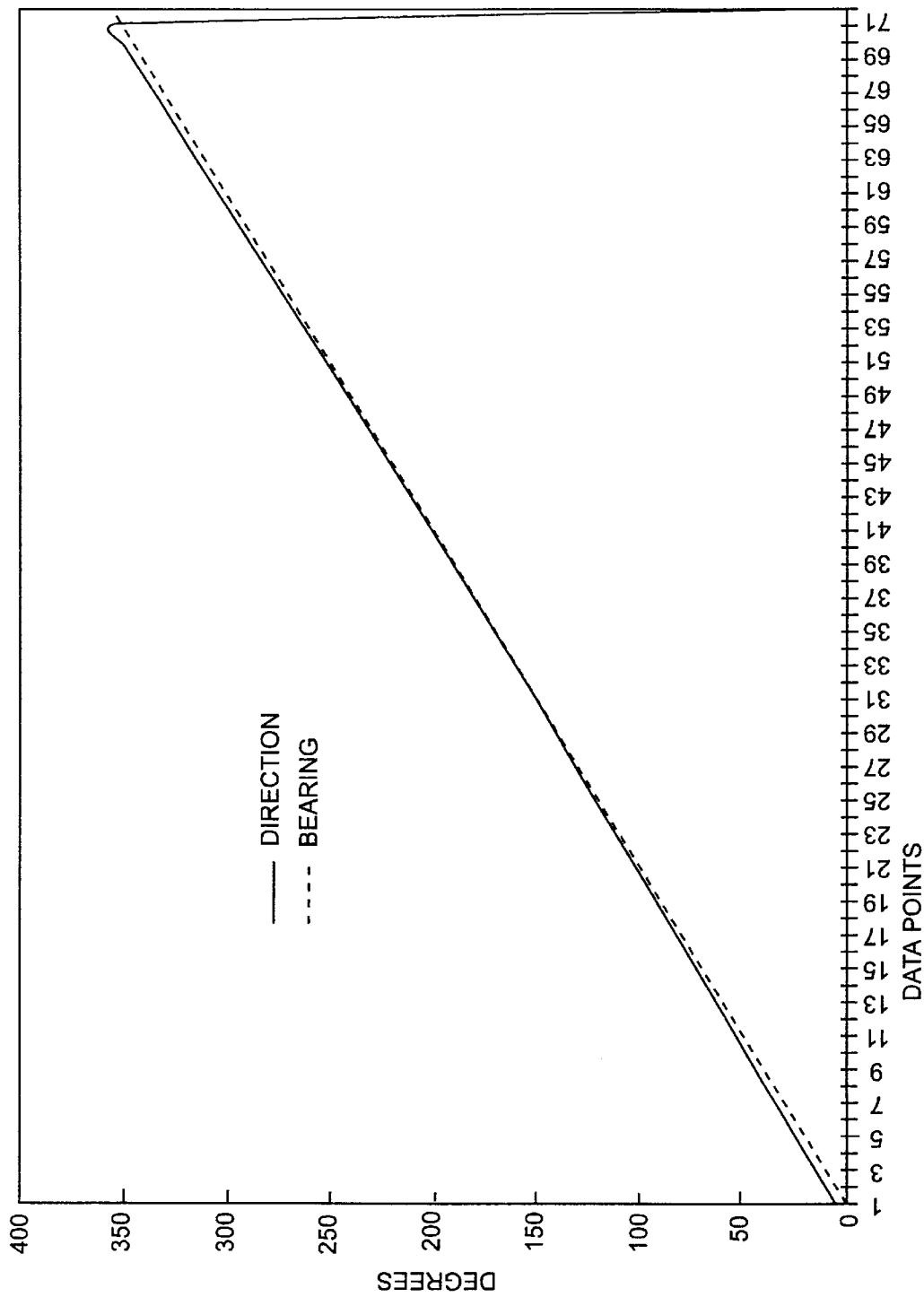
FIG. 17 is a graph of the results of the tests performed for FIG. 10 at a temperature of 60° C.
Figure 18:
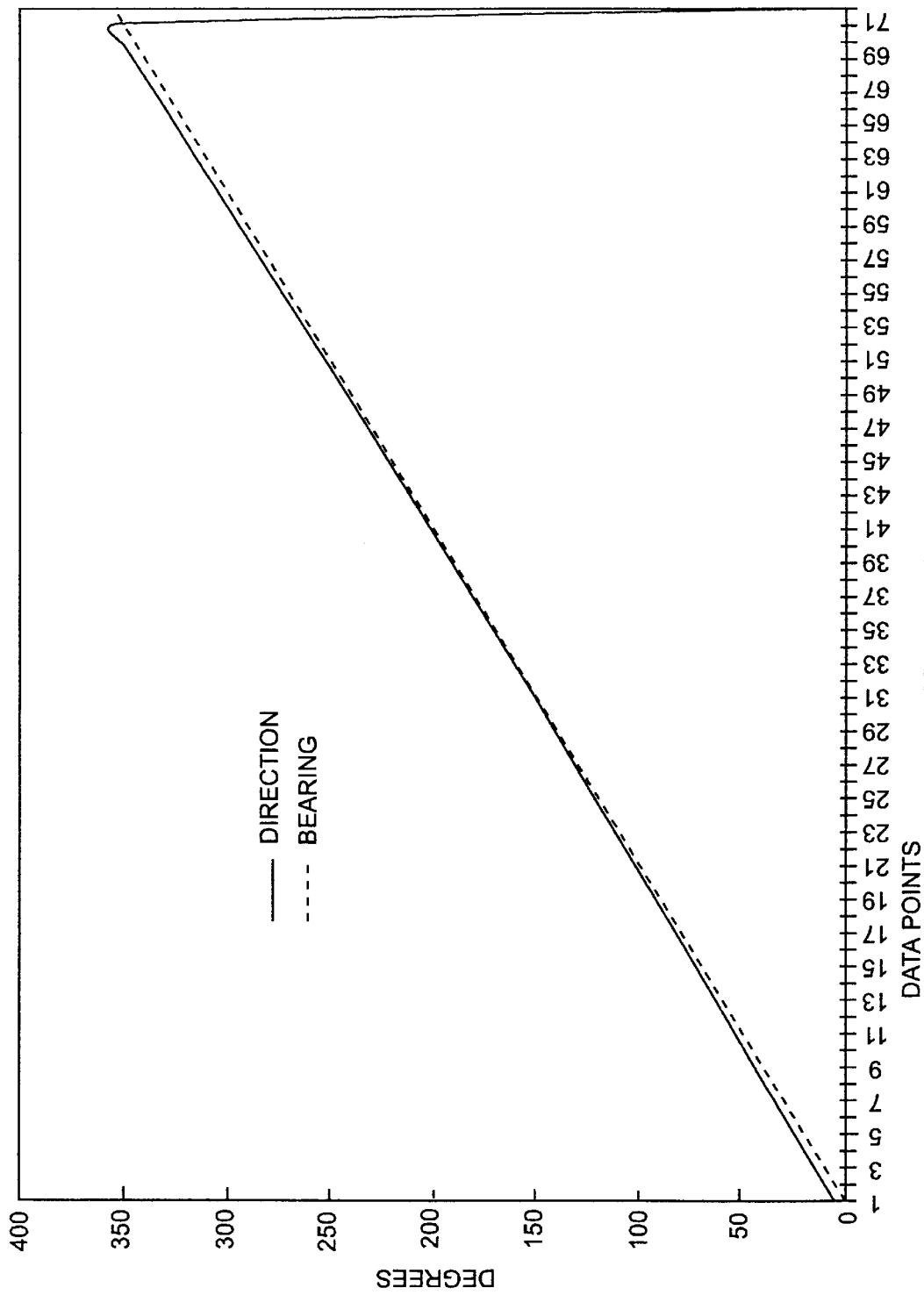
FIG. 18 is a graph of the results of the tests performed for FIG. 10 at a temperature of 70° C.; and, FIG. 19 is a flowchart of an algorithm for determining heading based on the frequencies of oscillation.
Figure 19:
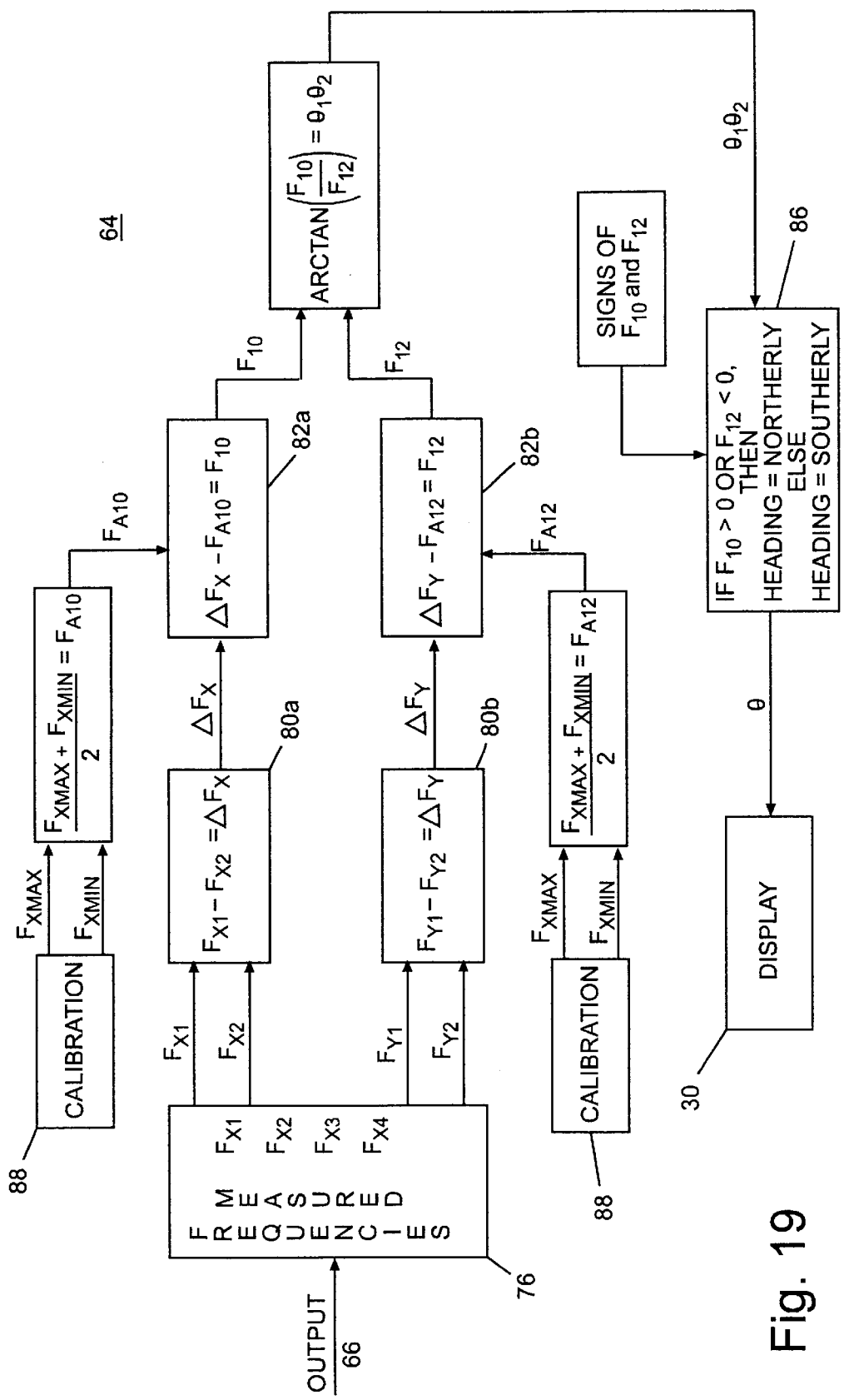

After the initial calibration and during normal operation, processor 28 of electronic compass 15 follows algorithm 64 to determine geographic heading. In a first step 76, processor 28 measures the frequencies of oscillation $F_{x1}$, $F_{x2}$, $F_{y1}$, and $F_{y2}$ using coils A and B of coil assemblies 10 and 12 as received through output 66 of oscillator 16 (FIG. 11). In steps 80a and 80b of algorithm 64, processor 28 computes a first difference, $\Delta F_x$, between frequencies $F_{x1}$ and $F_{x2}$, and a second difference, $\Delta F_y$, between frequencies $F_{y1}$ and $F_{y2}$. In step 82a, processor 28 computes a first calibrated difference, $F_{10}$, by subtracting the first frequency component due to the automobile's magnetic field, $F_{a10}$, from $\Delta F_x$. In step 82b, processor 28 computes a second calibrated difference, $F_{12}$, by subtracting the other frequency component, $F_{12}$, due to the automobile's magnetic field. As described above, the automobile frequency components are generated in calibration step 88. In step 84, processor 28 computes first and second heading results $\theta_1$ and $\theta_2$ by calculating the arctangents of the ratio of calibrated differences $F_{10}$ and $F_{12}$. To determine which heading result is correct, $\theta_1$ or $\theta_2$, processor 28 executes step 86 of algorithm 64.

Algorithm 64 determines which of the multiple heading results is correct by examining the signs of the calibrated differences $F_{10}$ and $F_{12}$. For the embodiment described herein, electronic compass 15 will always be pointed in a direction having a northerly component when $F_{10}$ is positive. When $F_{10}$ is negative, the direction of electronic compass 15 will have a southerly component. If $F_{10}$ is zero, then $F_{12}$ is used to determine whether the orientation of the compass 15 has a northerly or southerly component. This sign information can be used to resolve which arctangent is correct because no two arctangents will fall within the same 180° hemisphere. For example, if the arctangent function yields 45° and 225°, and $F_{10}$ is positive, the correct angle is 45° (from north) since this angle is the only one of the two having a northerly component.

It will be noted that it is not necessary for electronic compass 15 to operate in the region of the permeability curve (FIG. 5) where the squared H term dominates and that the primary advantage of doing so is that the direct proportionality of the frequency of oscillation with respect to the permeability simplifies the calculations of processor 28. When operating in this region, geographic orientation can be computed simply by calculating the arctangent of the ratio of the differences in frequency between coils A and B of coil assembly 10 and between coils A and B of coil assembly 12. Operating in a different region is perfectly acceptable, but changes in algorithm 64 will be required to take into account any non-linearity between the permeability and frequency before the arctangent function is calculated. Algorithm 64 optionally includes these changes. It will also be noted that algorithm 64 may optionally include steps for normalizing the measurement and calculations processor 28 performs.

It will be further noted that electronic compass 15 is not limited to operating in an automobile environment but includes any applications where a substantially static, ambient non-Earth magnetic field may exist. While the present invention has been described in terms of specific embodiments and modifications herein, it will be understood that additional modifications may be made without departing from the true scope and spirit of the invention as defined in the appended claims.

The embodiments of the invention in which an exclusive property or privilege is claimed are defined as follows:

1. An electronic compass comprising:
   at least two coil assemblies having magnetic axes which are oriented at a known angle to each other, each said coil assembly having at least a pair of substantially identical coils having magnetic axes that are parallel in a reverse sense, each of said coils having an inductance which varies as a function of the strength of a magnetic field in which it is positioned;
   at least one oscillator having frequencies of oscillation which are at least partially dependent upon the inductances of said coils;

a coil bias current source which causes current to flow in said coils;

at least one switch which alternatingly couples said coil bias current source to each of said coils of said coil assemblies; and, a processor electrically coupled to said at least one switch which analyzes said frequencies of oscillation of said at least one oscillator when each of said coils of said coil assemblies is coupled to said coil bias current source and computes geographic orientation based upon said analysis.

2. The electronic compass of claim 1 wherein each of said coil assemblies includes a magnetically permeable core, having a permeability which varies according to the strength of an externally applied magnetic field.

3. The electronic compass of claim 2 wherein each of said coil assemblies is wound on a bobbin having a hollow core, and each said magnetically permeable core is aligned with said magnetic axes of one of said coil assemblies and positioned inside said hollow core of said bobbin.

4. The electronic compass of claim 1 wherein said coils of said coil assemblies have a capacitance which, in combination with said inductance of said coils, substantially determines said frequency of oscillation of said oscillator.

5. The electronic compass of claim 1 wherein said coil bias current source is a constant current source.

6. The electronic compass of claim 1 wherein said at least one switch includes at least four transistors electrically coupled between said coils and said constant current source, said at least four transistors controlled by said processor.

7. The electronic compass of claim 6 wherein each of said at least four transistors is electrically coupled to one of said coils of said at least two coil assemblies, each of said bases of said at least four transistors is electrically coupled to said processor and each of said emitters of said at least four transistors is electrically coupled to a common node.

8. The electronic compass of claim 7 wherein said common node is connected to said constant current source.

9. The electronic compass of claim 1 further including a display electrically coupled to said processor, said display producing a visibly readable output showing the geographic orientation of the compass.

10. The electronic compass of claim 9 wherein said display is a compass mirror.

11. The electronic compass of claim 2 wherein said magnetically permeable cores are plates.

12. The electronic compass of claim 10 wherein said plates have rectangular cross-sections.

13. The electronic compass of claim 2 wherein said magnetically permeable cores have a direct current relative permeability of greater than approximately 80,000.

14. The electronic compass of claim 5 wherein said constant current source includes an operational amplifier, a MOSFET, a sense voltage, and a reference voltage, said sense voltage is fed to a non-inverting input of said operational amplifier where said voltage is subsequently servoed to said reference voltage and said MOSFET adjusts itself to maintain said sense voltage.

15. The electronic compass of claim 1 wherein said oscillator is an LC oscillator.

16. The electronic compass of claim 1 wherein said processor computes geographic orientation by calculating the arctangent of the ratio of the difference in frequencies of oscillation between said pair of substantially identical coils in one of said coil assemblies and the difference in frequencies of oscillation between said pair of substantially identical coils in another of said coil assemblies.

17. The electronic compass of claim 1 wherein said processor stores values corresponding to the maximum and minimum frequency differences between said substantially identical coils for each coil assembly as said compass is incrementally rotated 360 degrees during a calibration sequence.

18. The electronic compass of claim 1 wherein said processor executes an algorithm which removes from the computed geographic orientation inaccuracies generated by an ambient, non-Earth magnetic field.

19. An electronic compass, comprising:

at least two coil assemblies wound around magnetically permeable cores, said coil assemblies having magnetic axes which are oriented at a known angle to each other, said coil assemblies having inductances, and said coil assemblies each comprising bifilar wound coils;

at least one oscillator having frequencies of oscillation which are at least partially dependent upon the inductances of said coil assemblies;

a constant current source which causes current to flow in said coils of said coil assemblies;

at least one switch which alternatingly couples said constant current source to each of said coils of said coil assemblies so as to allow current from said constant current source to alternatingly flow through each of said bifilar wound coils of said coil assemblies; and, a processor electrically coupled to said at least one switch which controls said switch and which compares said frequency of oscillation of said at least one oscillator when each of said coils of said coil assemblies is coupled to said constant current source and computes geographic orientation based upon said comparison.

20. The electronic compass of claim 19 wherein said magnetically permeable cores, have a permeability which varies according to the strength of an externally applied magnetic field.

21. The electronic compass of claim 20 wherein each of said coil assemblies is wound on a bobbin having a hollow core, and each said magnetically permeable core is aligned with said magnetic axes of one of said coil assemblies and positioned inside said hollow core of said bobbins.

22. The electronic compass of claim 20 wherein said bifilar wound coils of said coil assemblies have a capacitance which, in combination with said inductance of said coils, substantially determines said frequency of oscillation of said oscillator.

23. The electronic compass of claim 20 wherein said at least one switch includes at least four transistors electrically coupled between said coils and said constant current source, said at least four transistors controlled by said processor.

24. The electronic compass of claim 23 wherein each of said at least four transistors is electrically coupled to one of said coils of said at least two coil assemblies, each of said bases of said at least four transistors is electrically coupled to said processor and each of said emitters of said at least four transistors is electrically coupled to a common node.

25. The electronic compass of claim 24 wherein said common node is connected to said constant current source.

26. The electronic compass of claim 20 further including a display electrically coupled to said processor, said display producing a visibly readable output showing the geographic orientation of the compass.

27. The electronic compass of claim 20 wherein said display is a compass mirror.

28. The electronic compass of claim 20 wherein said magnetically permeable cores are plates having rectangular cross-sections.

29. The electronic compass of claim 20 wherein said magnetically permeable cores have a direct current relative permeability of greater than approximately 80,000.

30. The electronic compass of claim 20 wherein said constant current source includes an operational amplifier, a MOSFET, a sense voltage, and a reference voltage, said sense voltage is fed to a non-inverting input of said operational amplifier where said voltage is subsequently servoed to said reference voltage and said MOSFET adjusts itself to maintain said sense voltage.

31. The electronic compass of claim 20 wherein said oscillator is an LC oscillator.

32. The electronic compass of claim 20 wherein said processor computes geographic orientation by calculating the arctangent of the ratio of the difference in frequencies of oscillation between said pair of substantially identical coils in one of said coil assemblies and the difference in frequencies of oscillation between said pair of substantially identical coils in another of said coil assemblies.

33. The electronic compass of claim 20 wherein said processor stores values corresponding to the maximum and minimum frequency differences between said substantially identical coils for each coil assembly as said compass is incrementally rotated 360 degrees during a calibration sequence.

34. The electronic compass of claim 20 wherein said processor executes an algorithm which removes from the computed geographic orientation inaccuracies generated by an ambient, non-Earth magnetic field.

35. A method for electronically determining geographic orientation comprising the steps of:
   providing at least two coil assemblies each having a magnetically permeable core, each said coil assembly having two substantially identical bifilar wound coils having magnetic axes that are collinear but oppositely oriented, and each of said two substantially identical bifilar wound coils having an inductance which varies as a function of the strength of an externally applied magnetic field;
   providing an oscillator having a frequency of oscillation which is at least partially determined by said inductance of said coils;
   alternatingly inducing a current in each of said coils while monitoring the frequency of oscillation of said oscillator; and
   calculating heading from the frequency of oscillation of said oscillator when said current is induced in each of said coils.

36. The method of claim 35 wherein said step of calculating heading further includes the steps of:
   computing a first difference between said frequencies of oscillation of said oscillator when current is induced in each of said two coils of one of said at least two coil assemblies;
   computing a second difference between said frequencies of oscillation of said oscillator when current is induced in each of said two coils of another of said at least two coil assemblies; and
   computing the arctangents of the ratio of said first and said second differences.

37. The method of claim 36 further including the steps of selecting one of said arctangents based on whether said first difference is positive or negative and whether said second difference is positive or negative.

38. The method of claim 35 further including a calibration step consisting of:
   incrementally rotating said at least two coil assemblies through one revolution;
   generating a first series of data by computing a first difference between said frequencies of oscillation of said oscillator when current is induced in each of said two coils of one of said at least two coil assemblies for each increment of rotation;
   generating a second series of data by computing a second difference between said frequencies of oscillation of said oscillator when current is induced in each of said two coils of another of said at least two coil assemblies;
   selecting a maximum and minimum first difference from said first series of data;
   calculating a first calibration number by summing said maximum and said minimum first differences and dividing the sum by two;
   selecting a maximum and minimum second difference from said second series of data; and
   calculating a second calibration number by summing said maximum and said minimum second differences and dividing the sum by two.

39. The method of claim 38 further including the steps of:
   computing a first difference between said frequencies of oscillation of said oscillator when current is induced in each of said two coils of one of said at least two coil assemblies;
   computing a second difference between said frequencies of oscillation of said oscillator when current is induced in each of said two coils of another of said at least two coil assemblies;
   subtracting said first calibration number from said first difference to yield a first result;
   subtracting said second calibration number from said second difference to yield a second result; and
   computing the arctangents of a ratio of said first and second results.

40. The method of claim 39 further including the steps of selecting one of said arctangents based on whether said first result is positive or negative and whether said second result is positive or negative.

41. An electronic compass, comprising:
   at least two coils axially oriented at a known angle to each other, said at least two coils having inductances;
   at least one oscillator having frequencies of oscillation which are at least partially dependent upon said inductances of said at least two coils;
   a constant current source which causes current to flow in said coils of said coil assemblies;
   at least one switch which alternatingly couples said constant current source to each of said at least two coils as to allow current from said constant current source to alternatingly flow through each of said at least two coils; and,
   a processor which analyzes said frequencies of oscillation of said at least one oscillator when each of said coils is coupled to said constant current source and computes geographic orientation based upon said analysis.

* * * * *